United States Patent
Baek et al.

(10) Patent No.: US 11,357,099 B2
(45) Date of Patent: Jun. 7, 2022

(54) RF PACKAGE MODULE AND ELECTRONIC DEVICE COMPRISING RF PACKAGE MODULE

(71) Applicants: Samsung Electronics Co., Ltd., Suwon-si (KR); Ajou University Industry-Academic Cooperation Foundation, Suwon-si (KR)

(72) Inventors: Kwang-Hyun Baek, Hwaseong-si (KR); Sangwook Park, Suwon-si (KR); Dong Gun Kam, Suwon-si (KR); Young-ju Lee, Seoul (KR)

(73) Assignees: Samsung Electronics Co., Ltd., Suwon-si (KR); Ajou University Industry-Academic Cooperation Foundation, Suwon-si (KR)

(*) Notice: Subject to any disclaimer, the term of this patent is extended or adjusted under 35 U.S.C. 154(b) by 243 days.

(21) Appl. No.: 16/756,593

(22) PCT Filed: Dec. 6, 2017

(86) PCT No.: PCT/KR2017/014237
§ 371 (c)(1),
(2) Date: Apr. 16, 2020

(87) PCT Pub. No.: WO2019/078408
PCT Pub. Date: Apr. 25, 2019

(65) Prior Publication Data
US 2020/0245450 A1 Jul. 30, 2020

(30) Foreign Application Priority Data
Oct. 18, 2017 (KR) .................. 10-2017-0135243

(51) Int. Cl.
*H05K 1/02* (2006.01)
*H05K 1/11* (2006.01)
(Continued)

(52) U.S. Cl.
CPC ..... *H05K 1/0243* (2013.01); *H01L 23/49822* (2013.01); *H01L 23/49838* (2013.01);
(Continued)

(58) Field of Classification Search
None
See application file for complete search history.

(56) References Cited

U.S. PATENT DOCUMENTS 7,030,712 B2 * 4/2006 Brunette ............. H05K 1/0222
333/260
7,388,158 B2 6/2008 Yoon et al.
(Continued)

FOREIGN PATENT DOCUMENTS

KR 10-1136423 B1 4/2012
KR 10-2013-0042909 A 4/2013
(Continued)

OTHER PUBLICATIONS

English translation of the Written Opinion of the International Searching Authority for International Application No. PCT/KR2017/014237 dated Jul. 18, 2018, 4 pages.
(Continued)

*Primary Examiner* — Tuan A Tran

(57) ABSTRACT

The disclosure relates to research (No. GK17N0100, millimeter wave 5G mobile communication system development) that was conducted with the support of the "Cross-Departmental Giga KOREA Project" funded by the government (the Ministry of Science and ICT) in 2017.
An Radio Frequency (RF) package module according to various embodiments and an electronic device including the RF package module are provided.
The RF package module according to an embodiment includes a sub module including an Radio Frequency Integrated Chip (RFIC); an antenna configured to transmit and
(Continued)

receive a signal wirelessly through a predetermined metal pattern; and a multi-layer circuit board including a plurality of layers in which a signal via for transferring the signal between the RFIC and the antenna and one or more ground vias are formed, wherein the antenna is spaced from the one or more ground vias by one or more anti-pads.

13 Claims, 7 Drawing Sheets

(51) Int. Cl.
  *H01Q 1/48* (2006.01)
  *H01Q 9/04* (2006.01)
  *H01L 23/498* (2006.01)
  *H01L 23/66* (2006.01)
  *H01Q 1/22* (2006.01)
  *H04B 1/40* (2015.01)

(52) U.S. Cl.
  CPC ........... *H01L 23/66* (2013.01); *H01Q 1/2283* (2013.01); *H01Q 1/48* (2013.01); *H01Q 9/0407* (2013.01); *H04B 1/40* (2013.01); *H05K 1/115* (2013.01); *H01L 2223/6616* (2013.01); *H01L 2223/6677* (2013.01); *H05K 2201/10098* (2013.01)

(56) References Cited

U.S. PATENT DOCUMENTS

| | | | | |
|---|---|---|---|---|
| 8,269,671 | B2 * | 9/2012 | Chen | H01L 23/66 343/893 |
| 8,797,117 | B2 * | 8/2014 | Shimakawa | H03H 7/0115 333/32 |
| 8,944,335 | B2 * | 2/2015 | Dokai | H01L 23/66 235/492 |
| 9,041,074 | B2 | 5/2015 | Hong et al. | |
| 9,070,961 | B2 * | 6/2015 | Suzuki | H05K 1/0237 |
| 9,084,353 | B2 * | 7/2015 | De Geest | H05K 1/024 |
| 9,190,732 | B2 * | 11/2015 | Fujii | H01Q 9/0414 |
| 9,337,526 | B2 | 5/2016 | Hong et al. | |
| 9,496,613 | B2 * | 11/2016 | Sawa | H01Q 9/045 |
| 9,560,741 | B2 * | 1/2017 | Rose | H05K 1/0251 |
| 9,589,908 | B1 | 3/2017 | Parmon | |
| 9,680,232 | B2 * | 6/2017 | Markish | H01Q 21/067 |
| 9,882,288 | B2 * | 1/2018 | Black | H01H 59/0009 |
| 10,153,556 | B2 * | 12/2018 | Ganchrow | H01Q 1/50 |
| 10,216,884 | B2 * | 2/2019 | Chun | G06F 30/394 |
| 10,490,879 | B2 | 11/2019 | Baek et al. | |
| 10,566,702 | B2 * | 2/2020 | Hashimoto | H01Q 21/064 |
| 10,575,396 | B2 * | 2/2020 | Shiozaki | H05K 1/0242 |
| 10,594,019 | B2 * | 3/2020 | Baks | H01Q 9/045 |
| 10,651,555 | B2 * | 5/2020 | Paulotto | H01Q 5/20 |
| 10,658,762 | B2 * | 5/2020 | Paulotto | H01Q 5/40 |
| 10,665,959 | B2 * | 5/2020 | Paulotto | H01Q 1/38 |
| 10,719,649 | B2 * | 7/2020 | Tsang | G06F 30/367 |
| 10,854,994 | B2 * | 12/2020 | Niroo Jazi | H01Q 21/22 |
| 2006/0060376 | A1 | 3/2006 | Yoon et al. | |
| 2009/0207080 | A1 | 8/2009 | Floyd et al. | |
| 2012/0212384 | A1 | 8/2012 | Kam et al. | |
| 2013/0099006 | A1 | 4/2013 | Hong et al. | |
| 2015/0194730 | A1 * | 7/2015 | Sudo | H01Q 5/378 343/905 |
| 2016/0336646 | A1 | 11/2016 | Baek et al. | |
| 2020/0044679 | A1 | 2/2020 | Heo et al. | |

FOREIGN PATENT DOCUMENTS

| | | |
|---|---|---|
| KR | 10-2016-0132649 A | 11/2016 |
| KR | 10-2018-0070380 A | 6/2018 |

OTHER PUBLICATIONS

ISA/KR, International Search Report and Written Opinion of the International Searching Authority, International Application No. PCT/KR2017/014237, dated Jul. 18, 2018, 8 pages.

\* cited by examiner

RF PACKAGE MODULE AND ELECTRONIC DEVICE COMPRISING RF PACKAGE MODULE

CROSS-REFERENCE TO RELATED APPLICATIONS

This application is a 371 National Stage of International Application No. PCT/KR2017/014237, filed Dec. 6, 2017, which claims priority to Korean Patent Application No. 10-2017-0135243, filed Oct. 18, 2017, the disclosures of which are herein incorporated by reference in their entirety.

BACKGROUND

1. Field

Various embodiments relate to a RF package module for ultra-high frequency band communication.

2. Description of the Related Art

With the development of wireless mobile communication technology, various technologies for improving a data transmission rate have been developed. In particular, after the $4^{th}$ generation (4G) communication systems have been commercialized, the amount of wireless data traffic has increased considerably. Accordingly, various technologies for communication systems using ultra-high frequency bands (for example, a frequency band of 60 GHz) are studied.

Because an ultra-high frequency band has a very short wavelength and undergoes relatively great signal attenuation, the ultra-high frequency band requires a transmission path from a Radio Frequency Integrated Circuit (RFIC) to an antenna as short as possible and securing a specific level of antenna performance. Also, RF package modules for ultra-high frequency band communication require relatively high manufacturing costs than general mobile communication terminals. For these reasons, an RF package module capable of securing a specific level of antenna performance while having reduced manufacturing costs is needed.

The disclosure relates to research (No. GK17N0100, millimeter wave 5G mobile communication system development) that has been conducted with the support of the "Cross-Departmental Giga KOREA Project" funded by the government (the Ministry of Science and ICT) in 2017.

SUMMARY

Various embodiments provide an RF package module capable of securing a specific level of antenna performance while having reduced manufacturing costs, and an electronic device including the RF package module.

An RF package module according to an embodiment includes: a sub module including an Radio Frequency Integrated Chip (RFIC); an antenna configured to transmit and receive a signal wirelessly through a predetermined metal pattern; and a multi-layer circuit board including a plurality of layers in which a signal via for transferring the signal between the RFIC and the antenna and one or more ground vias are formed, wherein the antenna is spaced from the one or more ground vias by one or more anti-pads.

DETAILED DESCRIPTION

Figure 1:
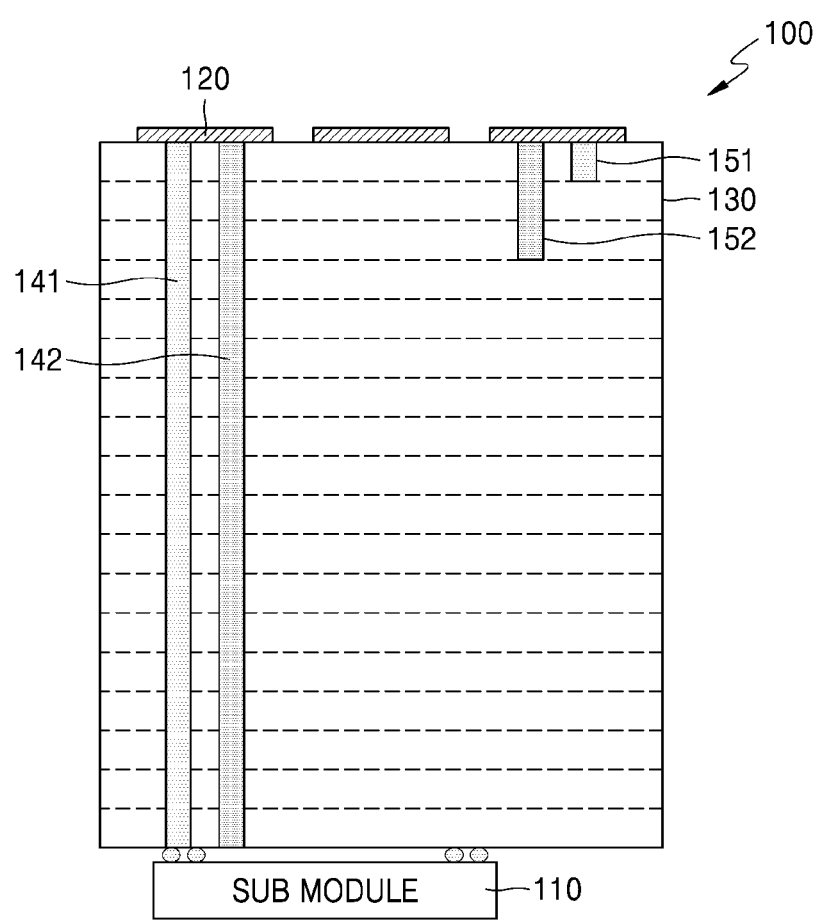
FIG. 1 shows a structure of an RF package module according to an embodiment.

An RF package module according to an embodiment includes: a sub module including an Radio Frequency Integrated Chip (RFIC); an antenna configured to transmit and receive a signal wirelessly through a predetermined metal pattern; and a multi-layer circuit board including a plurality of layers in which a signal via for transferring the signal between the RFIC and the antenna and one or more ground vias are formed, wherein the antenna is spaced from the one or more ground vias by one or more anti-pads.

The one or more anti-pads according to an embodiment may be arranged not to overlap each other.

A radius of the one or more anti-pads according to an embodiment may be greater by a predetermined length than a radius of pads of the one or more ground vias.

The sub module according to an embodiment may be connected to one surface of the multi-layer circuit board.

The sub module according to an embodiment may be connected to the multi-layer circuit board through a Ball Grid Array (BGA) process or a Land Grid Array (LGA) process.

The antenna according to an embodiment may include a patch antenna positioned on one surface of the multi-layer circuit board.

The RF package module according to an embodiment may be configured to radiate a signal in a millimeter band.

The signal via according to an embodiment may include a through hole via penetrating the plurality of layers of the multi-layer circuit board, and the one or more anti-pads may be formed in an area where the through hole via is connected to the antenna.

The one or more ground vias according to an embodiment may shield the signal via and be spaced by a predetermined distance or more from the signal via.

The one or more ground vias according to an embodiment may surround the signal via.

The sub module according to an embodiment may be a second multi-layer circuit board including the RFIC and a plurality of circuit devices electrically connected to the RFIC.

An electronic device according to an embodiment includes: a sub module including an Radio Frequency Integrated Chip (RFIC); an antenna configured to transmit and receive a signal wirelessly through a predetermined metal pattern; a multi-layer circuit board including a plurality of layers in which a signal via for transferring the signal between the RFIC and the antenna and one or more ground vias are formed, wherein the antenna is spaced from the one or more ground vias by one or more anti-pads; and a baseband module electrically connected to the multi-layer circuit board, and configured to transmit and receive a baseband signal to and from the RFIC and process the baseband signal.

Hereinafter, embodiments of the disclosure will be described in detail with reference to the accompanying drawings so that the disclosure may be readily implemented by those skilled in the art. However, the disclosure is not restricted by these embodiments but can be implemented in many different forms. Also, in the drawings, parts irrelevant to the description are omitted for the simplicity of explanation, and like reference numerals refer to like elements throughout the specification.

Although general terms being widely used in the disclosure were selected as terminology used in the disclosure while considering the functions of the disclosure, they may vary according to intentions of one of ordinary skill in the art, judicial precedents, the advent of new technologies, and the like. Hence, the terms must be defined based on the meanings of the terms and the content of the entire specification, not by simply stating the terms themselves.

Also, the terms used in the disclosure are used to describe the specific embodiments, not for the purpose of limiting the disclosure. It is to be understood that the singular forms "a," "an," and "the" include plural referents unless the context clearly dictates otherwise. It will be understood that when a component is referred to as being "connected" to another component, it can be "directly connected" to the other component or "electrically connected" to the other component with an intervening component. Throughout the specification, it will be understood that when a certain part "includes" a certain component, the part does not exclude another component but can further include another component, unless the context clearly dictates otherwise.

The term "said" and the similar terms used in the present specification, specifically, in the claims may indicate both single and plural. Also, if the order of operations for describing a method according to the disclosure is not definitely specified, the operations may be performed in appropriate order. However, the disclosure is not limited to the order in which the operations are described.

The phrases "in some embodiments" or "according to an embodiment" appearing in the present specification do not necessarily indicate the same embodiment.

Also, connection lines or connection members between components shown in the drawings are examples of functional connections and/or physical or circuital connections. In an actual apparatus, the connections between the components may be implemented in the form of various functional connections, physical connections, or circuital connections that can be replaced or added.

The disclosure will be described in detail with reference to the accompanying drawings.

FIG. 1 shows a structure of an RF package module according to an embodiment.

An RF package module 100 according to an embodiment may be included in various electronic devices (for example, a base station, a user terminal, etc.) that are used in a wireless communication system, and perform operations required for an electronic device to transmit and receive signals wirelessly.

Referring to FIG. 1, the RF package module 100 according to an embodiment may include a sub module 110 including a Radio Frequency Integrated Chip (RFIC), an antenna 120 for transmitting and receiving signals wirelessly through a predetermined metal pattern, and a multi-layer circuit board 130 configured with a plurality of layers.

The sub module 110 may include the RFIC. The sub module 110 according to an embodiment may be configured by mounting the RFIC on another circuit board that is different from the multi-layer circuit board 130, wherein a plurality of components (for example, a capacitor) electrically connected to the RFIC may be mounted together with the RFIC on the circuit board. For example, the multi-layer circuit board 130 may be configured with 18 layers, and a multi-layer circuit board constituting the sub module 110 may be configured with 8 layers, although not limited thereto.

The sub module 110 according to an embodiment may be connected to a lower end of the multi-layer circuit board 130, as shown in FIG. 1, by a Ball Grid Array (BGA) or a Land Grid Array (LGA).

The antenna 120 may transmit and receive signals wirelessly through the predetermined metal pattern. The antenna 120 according to an embodiment may include a patch antenna, as shown in FIG. 1. For example, the patch antenna may be a small-sized antenna capable of being mounted on the multi-layer circuit board 130, and include a rectangular patch antenna, a circular patch antenna, etc., although not limited thereto. The patch antenna may be used to radiate signals transmitted from the RFIC wirelessly or receive signals wirelessly. The patch antenna may be designed to have a pattern that is suitable to a frequency of a signal to be transmitted. For example, the patch antenna according to an embodiment may be designed to radiate signals of a millimeter band.

The antenna 120 according to an embodiment may be positioned on an upper end of the multi-layer circuit board 130, and include a plurality of antennas. Because the plurality of antennas are used, the RF package module 100 may transmit and receive signals wirelessly over a wide area. For example, when the RF package module 100 is used in a base station supporting millimeter band communication, the RF package module 100 may include thousands of antennas or more.

The multi-layer circuit board 130 may include a plurality of layers in which a signal via for transferring signals between the RFIC and the antennas and one or more ground vias are positioned, wherein the antennas may be spaced from the ground vias by one or more anti-pads.

On the multi-layer circuit board 130 according to an embodiment, components constituting an integrated circuit configured to transmit and receive signals wirelessly may be mounted, and the multi-layer circuit board 130 may include signal lines, power lines, and ground lines for electrically connecting the components to each other. Also, each layer of the multi-layer circuit board 130 may include a structure in which a conductive layer including a conductor is stacked on a dielectric layer including a dielectric material. For example, as the dielectric material, a Frame Retardant 4 (FR4)-based material, a metron-based material, and a teflon-based material may be used, although not limited thereto. Also, the conductor may include, for example, copper, although not limited thereto. A part of the plurality of layers constituting the multi-layer circuit board 130 may include a ground layer, and may include a plurality of ground vias connected to a plurality of ground layers as necessary.

The RF package module 100 according to an embodiment may further include an additional antenna (not shown) in addition to the antenna 120 positioned on the multi-layer circuit board 130 to improve transmission/reception performance of a radio frequency signal.

As shown in FIG. 1, when the sub module 110 including the RFIC is connected to the lower end of the multi-layer circuit board 130 and the antenna 120 is connected to the upper end of the multi-layer circuit board 130, a signal output from the RFIC may pass through the individual layers of the multi-layer circuit board 130 and then be transferred to the antenna 120. Also, the multi-layer circuit board 130 may include a signal transmission line for transferring signals output from the RFIC to the antenna 120. Also, the multi-layer circuit board 130 may transfer signals received wirelessly by the antenna 120 to the RFIC through the signal transmission line. For example, the signal transmission line may include a signal via 141 penetrating some layers of the plurality of layers of the multi-layer circuit board 130, and the signal via 141 may be a through hole via penetrating from a bottom layer to a top layer of the multi-layer circuit board 130. Also, the multi-layer circuit board 130 may include a signal via formed by a depth drill process. Unlike the through hole via penetrating from the bottom layer to the top layer, the depth drill process may be used to connect some layers of the plurality of layers constituting the multi-layer circuit board 130. For example, the depth drill process may be used to form a signal via connecting an outer layer (for example, the bottom layer or the top layer) of the multi-layer circuit board 130 to a part of a plurality of inner layers (for example, the remaining layers except for the bottom layer and the top layer) of the multi-layer circuit board 130. For example, referring to FIG. 1, the depth drill process may be used to form signal vias 151 and 152 connecting the top layer of the multi-layer circuit board 130 to a part of the plurality of inner layers of the multi-layer circuit board 130. Also, the depth drill process may be used to form a signal via connecting the bottom layer to a part of the plurality of inner layers, although not limited thereto.

As a signal transmitted through the signal via 141 has a higher frequency band, relatively greater signal loss may be generated by electromagnetic radiation that occurs when the signal is transmitted. Accordingly, to reduce a rate of signal loss occurring during signal transmission, one or more ground vias 142 for shielding the signal via 141 may be provided. The one or more ground vias 142 may surround the signal via 141 and may be spaced a predetermined distance or more from the signal via 141. In FIG. 1, for convenience of description, one signal via 141 and one ground via 142 are shown, however, the numbers of the signal via 141 and the ground via 142 are not limited. For example, the RF package module 100 may include a plurality of signal vias, and two to four ground vias may be positioned with each signal via as the center. The number of the ground vias 142 positioned to shield each signal via may change according to embodiments.

Because the ground vias 142 are used to shield the signal via 141, a structure for preventing the ground vias 142 from electrically connecting to the antenna 120 may be needed. For example, the RF package module 100 in which a conductor (for example, copper) existing at a connection area between the ground vias 142 and the antenna 120 is removed by a back-drilling process, or an RF package module 100c including a laser via may prevent the ground vias 142 from electrically connecting to the antenna 120. However, a structure in which the multi-layer circuit board 130 including the antenna 120 is separated from the sub module 110 including the RFIC, as shown in FIG. 1, has disadvantages that it is difficult to remove the conductor (for example, copper) existing at the connection area between the ground vias 142 and the antenna 120 by using a back-drilling process and the laser via requires relatively high processing cost.

In the RF package module 100 according to an embodiment, the ground vias 142 may be spaced from the antenna 120 by one or more anti-pads. Accordingly, manufacturing cost of the RF package module 100 may be relatively reduced compared to when a laser via is used.

Figure 2:
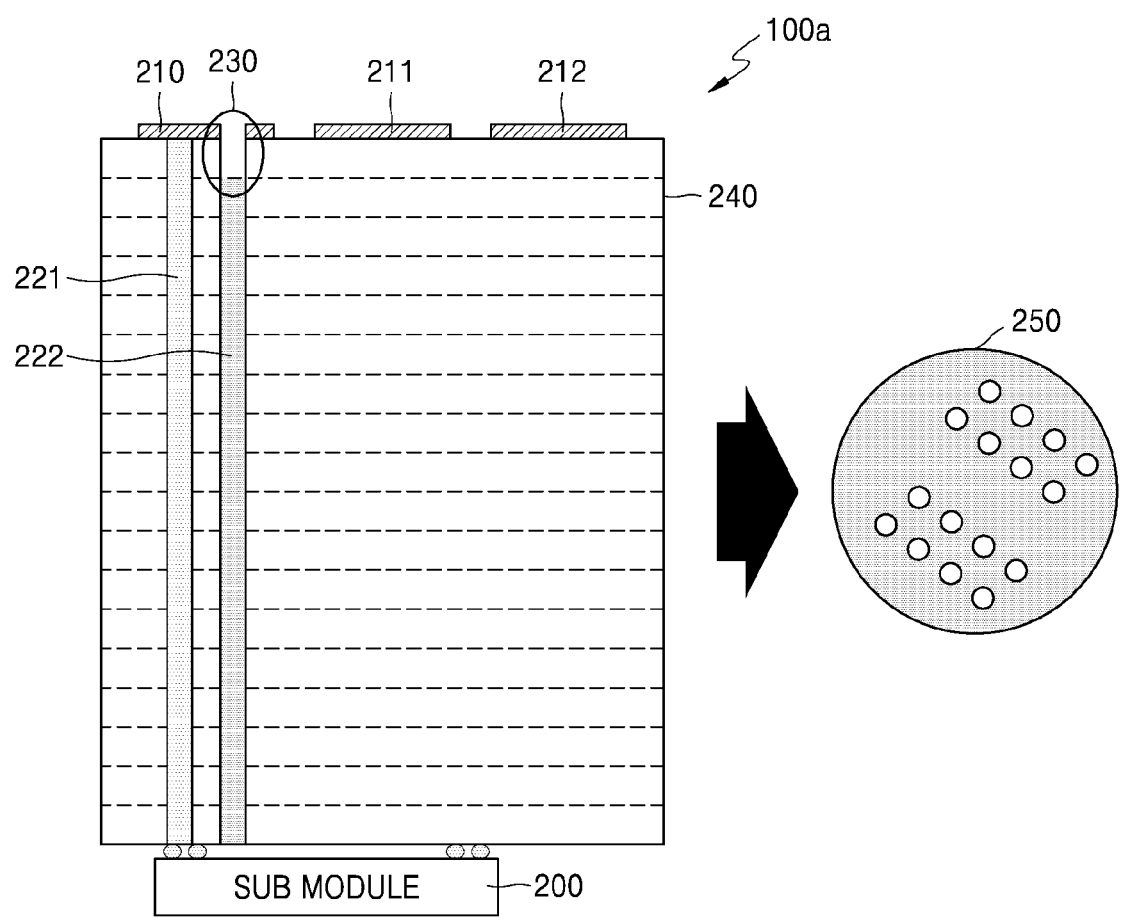
FIG. 2 shows an example of an RF package module in which a ground via is spaced from an antenna by a back-drilling process.

FIG. 2 shows an example of an RF package module in which a ground via is spaced from an antenna by a back-drilling process.

The RF package module according to an embodiment may include a multi-layer circuit board in which a conductor (for example, copper) existing at a connection area between one or more ground vias and an antenna is removed by a back-drilling process. The back-drilling process means a process of removing unnecessary conductors from vias of a multi-layer circuit board.

Referring to FIG. 2, an RF package module 100a may include a signal via 221 for transmitting signals between an RFIC and an antenna 210, and one or more ground vias 222 for shielding the signal via 221. To prevent the one or more ground vias 222 from electrically connecting to the antenna 210, the RF package module 100a may have a structure 230 in which a conductor existing at a connection area between the one or more ground vias 222 and the antenna 210 is removed. The conductor existing at the connection area between the one or more ground vias 222 and the antenna 210 may be removed by a back-drilling process. Because the conductor is removed by the back-drilling process, the antenna 210 positioned on a top layer of a multi-layer circuit board 240 may include one or more holes. Referring to the RF package module 100a shown in FIG. 2, one signal via 221 and one ground via 222 are shown, however, the numbers of the signal via 221 and the ground via 222 for shielding the signal via 221 may change according to embodiments. For example, the RF package module 100a may include a plurality of signal vias, and two to four ground vias may be positioned to shield each signal via. Accordingly, the antenna 210 positioned on the top layer of the multi-layer circuit board 240 may include a plurality of holes, like a patch antenna 250 shown in FIG. 2.

When the RF package module 100a according to an embodiment is included in a base station supporting millimeter band communication, the RF package module 100a may include thousands of antennas or more. Accordingly, the RF package module 100a having a structure in which the antenna 210 is mounted on the multi-layer circuit board 240 and a sub module 200 including an RFIC is connected to a bottom layer of the multi-layer circuit board 240 may include a plurality of signal vias for transferring signals between the RFIC and a plurality of antennas 210, 211, and 212 and a plurality of ground vias for shielding the plurality of signal vias. Accordingly, a structure for spacing each ground via from the antennas 210, 211, and 212 may be needed. However, it may be not easy to remove conductors existing at connection areas between the plurality of ground vias and the antennas 210, 211, and 212 by a back-drilling process. Also, as the number of the ground vias for shielding the signal vias increases, the number of holes that are included in the antenna 250 may also increase, which may influence performance of the antenna 250.

Figure 3:
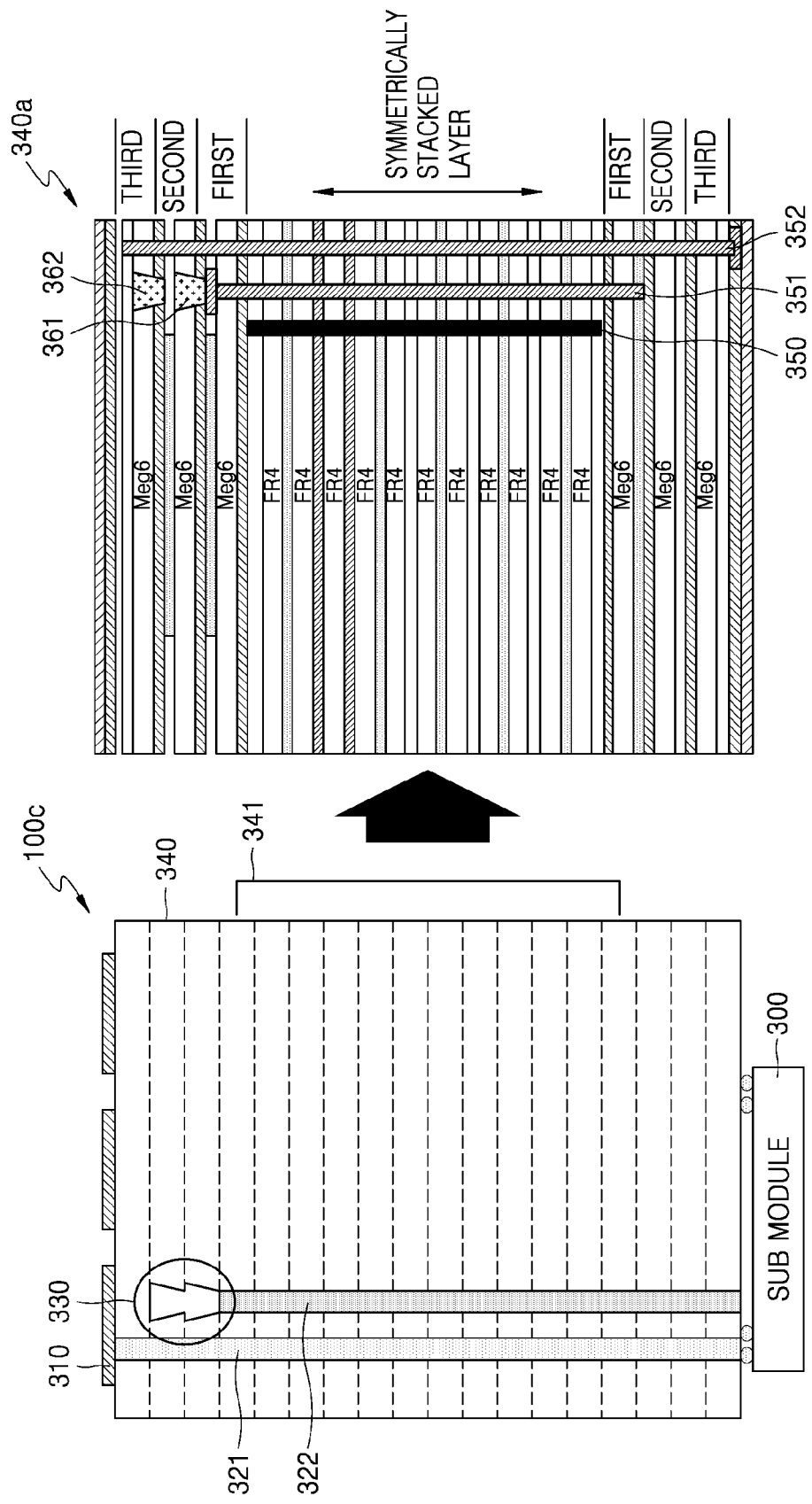
FIG. 3 shows an example of an RF package module including a laser via.

FIG. 3 shows an example of an RF package module including a laser via.

Referring to FIG. 3, an RF package module 100c according to an embodiment may be included in a base station, and the RF package module 100c included in the base station may include a plurality of antennas. For example, when the RF package module 100c is included in a base station supporting millimeter band communication, the RF package module 100c may have a structure in which a sub module 300 including an RFIC is connected to a lower end of a multi-layer circuit board 340 and an antenna 310 is mounted on the multi-layer circuit board 340. At this time, the RF package module 100c may include a laser via 330, instead of a structure in which a conductor existing at a connection area between a ground via and an antenna is removed by a back-drilling process. Unlike a through hole via that is formed after all of a plurality of layers constituting the multi-layer circuit board 340 are stacked, the laser via 330 may be formed in a process of symmetrically stacking layers one by one after stacking some inner layers 341 among the plurality of layers constituting the multi-layer circuit board 340.

For example, in the example of FIG. 2, after all of the plurality of layers constituting the multi-layer circuit board 240 are stacked, through hole vias (that is, the signal via 221 and the ground vias 222) may be formed and then a back-drilling process may be performed. Unlike the example of FIG. 2, referring to FIG. 3, some inner layers (for example, layers including a FR4-based material as a dielectric) 341 among the plurality of layers constituting the multi-layer circuit board 340 may be stacked, and then a through hole via 350 may be formed. Also, when the layers are symmetrically stacked one by one on the top and lower ends of the multi-layer circuit board 130, the laser via 330 may be formed as necessary. Accordingly, the RF package module 100c including the laser via 330 may prevent the ground via 322 from electrically connecting to the antenna 310, without using the structure in which the conductor existing at the connection area between the ground via and the antenna is removed by the back-drilling process.

A multi-layer circuit board 340a shown in FIG. 3 shows a detailed structure of the multi-layer circuit board 340 of the RF package module 100c including the laser via 330.

The multi-layer circuit board 340a according to an embodiment may include a plurality of layers, and each layer may have a structure in which a conductive layer including a conductor is stacked on a dielectric layer including a dielectric material. Some inner layers among the plurality of layers constituting the multi-layer circuit board 340a may include a FR4-based material as a dielectric, and some outer layers of the multi-layer circuit board 340a may include a metron (for example, Meg6)-based material as a dielectric.

In the multi-layer circuit board 340a of the RF package module 100c including the laser via 330, some layers including a FR4-based material as a dielectric may be stacked, and then a through hole via 350 penetrating the some layers including the FR-based material as the dielectric may be formed, instead that a plurality of layers are stacked at a time. Layers including a metron (for example, Meg6)-based material as a dielectric may be stacked symmetrically, and laser vias 361 and 362 may be formed in a process of stacking the layers including the metron-based material as the dielectric. Accordingly, the multi-layer circuit board 340a of the RF package module 100c including the laser via 330 may require a plurality of lamination processes. The multi-layer circuit board 340a of the RF package module 100c may connect a signal via to an antenna and prevent a ground via from electrically connecting to the antenna, by using through hole vias and laser vias together.

However, as the number of lamination processes increases when the multi-layer circuit board 340a is manufactured, manufacturing cost may increase accordingly. Because the multi-layer circuit board 340a of the RF package module 100c including laser vias requires a plurality of lamination processes, the multi-layer circuit board 340a may require higher manufacturing cost than the multi-layer circuit board 240 including the structure 230 in which the conductor existing at the connection area between the ground vias 222 and the antenna 210 is removed by a back-drilling process. To reduce total manufacturing cost of the RF package module 100c, a method for securing a specific level of antenna performance, while reducing the number of lamination processes may be needed.

Figure 4:
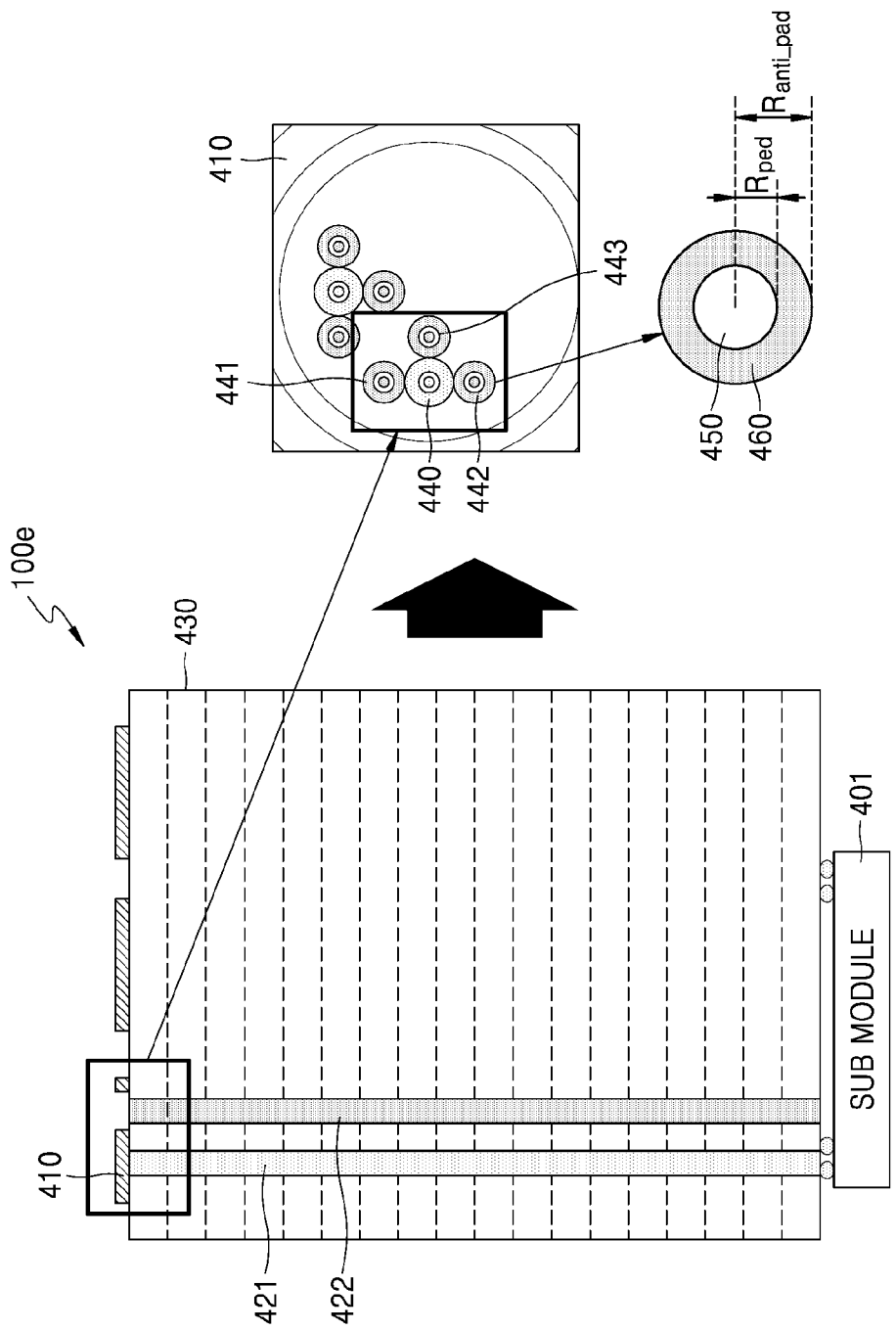
FIG. 4 shows an example of an RF package module in which one or more ground vias are spaced from an antenna by an anti-pad according to an embodiment.

FIG. 4 shows an example of an RF package module in which one or more ground vias are spaced from an antenna by an anti-pad according to an embodiment.

Referring to FIG. 4, a RF package module 100e may have a structure in which an antenna 410 is spaced from one or more ground vias 422 by an anti-pad formed at a connection area between the one or more ground vias 422 and the antenna 410.

The anti-pad may be used to prevent a via from electrically connecting to a conductor (for example, copper) constituting a multi-layer circuit board, and may mean a predetermined gap area existing between the via and the conductor.

As described above, the one or more ground vias 422 may be positioned to shield a signal via 421, and the anti-pad may be formed at a connection area between the ground vias 422 and the antenna 410. Accordingly, the antenna 410 may include a hole formed by the anti-pad.

Referring to the multi-layer circuit board 430 shown in FIG. 4, for convenience of description, one signal via 421 and one ground via 422 are shown, however, the numbers of the signal via 421 and the ground via 422 are not limited. The multi-layer circuit board 430 may include a plurality of signal vias, and a plurality of ground vias for shielding the plurality of signal vias, respectively. For example, as shown in FIG. 4, three ground vias may be provided to shield one signal via 440. Also, each ground via may be prevented from electrically connecting to the antenna 410 by anti-pads 441, 442, and 443. Referring to the antenna 410 shown in a right part of FIG. 4, an area corresponding to each of the anti-pads 441, 442, and 443 may appear as three circles having different radiuses. A circle having a smallest radius among the three circles may represent a ground via hole, and a circle having a second smallest radius among the three circles may represent a pad of the ground via. Also, a circle having a greatest radius among the three circles may represent an anti-pad. In a right lower part of FIG. 4, for convenience of description, a pad 450 of a ground via and an anti-pad 460 are shown. The anti-pad 460 may be represented in a shape including a circle representing the pad 450 of the ground via. The pad 450 of the ground via may represent an area where a hole forming the ground via is coated by a conductor (for example, copper). A radius of the pad 450 of the ground via may be greater than a radius of the hole forming the ground via, and a radius of the anti-pad 460 may be greater by a predetermined value or more than the radius of the pad 450. The radius of the anti-pad 460 may change according to embodiments, and a process of setting the radius of the anti-pad 460 to an appropriate value may be needed to secure a specific level of antenna performance.

Figure 5:
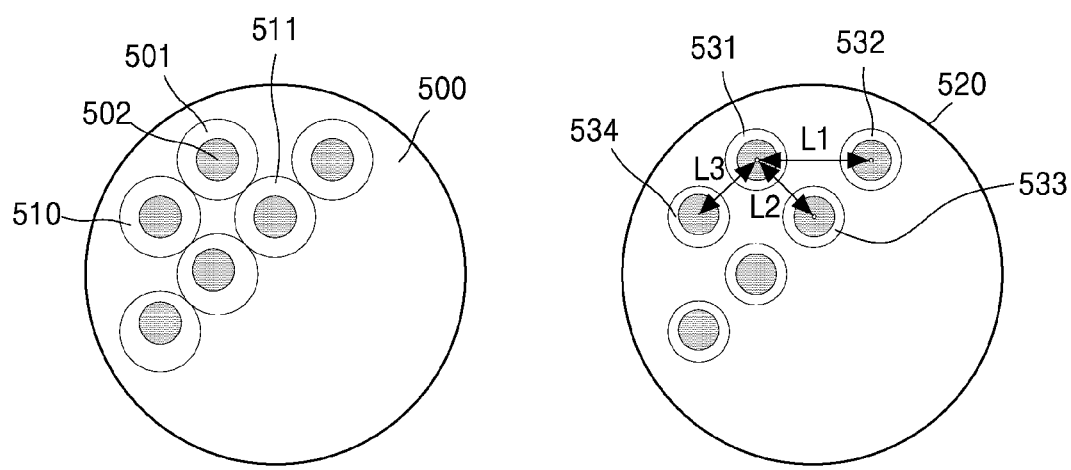
FIG. 5 shows an example of setting a radius of an anti-pad according to an embodiment.

FIG. 5 shows an example of setting a radius of an anti-pad according to an embodiment.

Anti-pads included in the RF package module 100 according to an embodiment may be arranged not to overlap each other. Also, as described above, a radius of each anti-pad may be greater by a predetermined value or more than that of a pad of a ground via, to prevent the ground via from electrically connecting to the antenna.

Referring to 500 of FIG. 5 showing an exemplary anti-pad arrangement, when radiuses of a plurality of anti-pads 501, 510, and 511 are set to be excessively greater than those of pads 502 of ground vias, the anti-pads 501, 510, and 511 may overlap each other. When the anti-pads 501, 510, and 511 overlap each other, an effect of shielding signal vias may be reduced, and accordingly, it may be difficult to secure a specific level of antenna performance. Accordingly, radiuses of anti-pads according to an embodiment may be set to be greater by a predetermined value or more than those of pads of ground vias, while preventing the anti-pads from overlapping each other.

Also, referring to 520 of FIG. 5 showing an anti-pad arrangement according to another embodiment, when a plurality of anti-pads 531, 532, 533, and 534 exist, distances (for example, L1, L2, and L3) from a center of a circle representing each anti-pad (for example, the anti-pad 531) to centers of circles representing the remaining anti-pads (for example, the anti-pads 532, 533, and 534) may be measured. To arrange the plurality of anti-pads 531, 532, 533, and 534 not to overlap each other, radiuses of the plurality of anti-pads 531, 532, 533, and 534 may be set to values that are smaller than ½ of a minimum value of the measured distances L1, L2, and L3 between the anti-pads 531, 532, 533, and 534.

Figure 6:
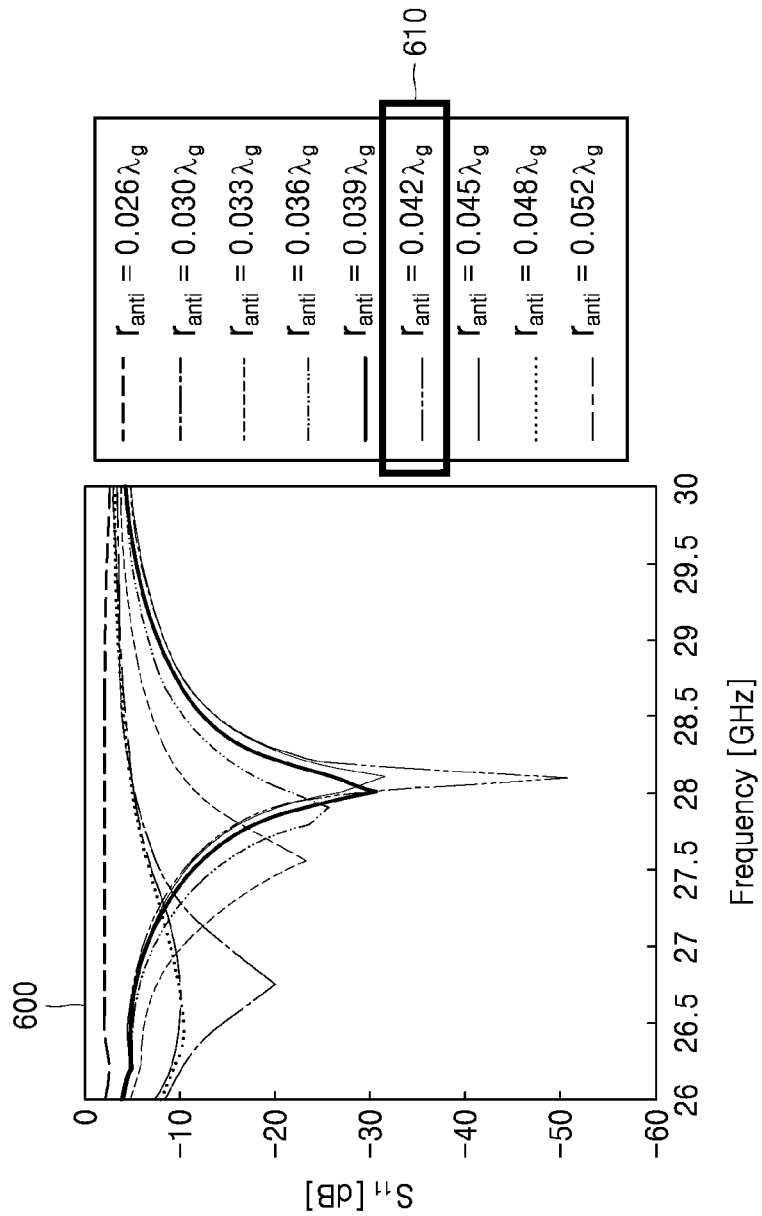
FIG. 6 is a view for describing different performances of an RF package module depending on radiuses of anti-pads according to an embodiment.

FIG. 6 is a view for describing different performances of an RF package module depending on radiuses of anti-pads according to an embodiment.

Referring to a graph 600 shown in FIG. 6, it is seen that antenna performance of a RF package module changes according to radiuses of anti-pads. Referring to FIG. 6, an X-axis of the graph 600 represents frequency bands, and an y-axis of the graph 600 represents $S_{11}$ parameter values according to the frequency bands.

A radius of anti-pads according to an embodiment may be set considering a kind of a dielectric constituting the multi-layer circuit board 430 (see FIG. 4) on which antennas are mounted, a target frequency of the antennas, a bandwidth of the antennas, an antenna gain, etc.

A $S_{11}$ parameter represents return loss of a circuit having an input port and an output port. As a $S_{11}$ value corresponding to a target frequency of an antenna is smaller, a greater portion of an input signal of the target frequency is transferred to the output port. Accordingly, as a $S_{11}$ value corresponding to a target frequency of an antenna is smaller, radiation performance of the antenna may be determined to be more excellent.

Referring to FIG. 6, when a target frequency of the RF package module 100 according to an embodiment is 28 GHz, and a radius of anti-pads is 0.042 $\lambda_g$, a $S_{11}$ parameter value corresponding to 28 GHz is smallest. $\lambda_g$ may be determined according to an dielectric constant of a dielectric constituting a surface of the multi-layer circuit board 130 on which the antenna 120 is mounted and a dielectric constant of air. The RF package module 100 according to an embodiment may further improve antenna performance at a target frequency band through a structure including anti-pads designed considering a radius of the anti-pads and $\lambda_g$.

Figure 7:
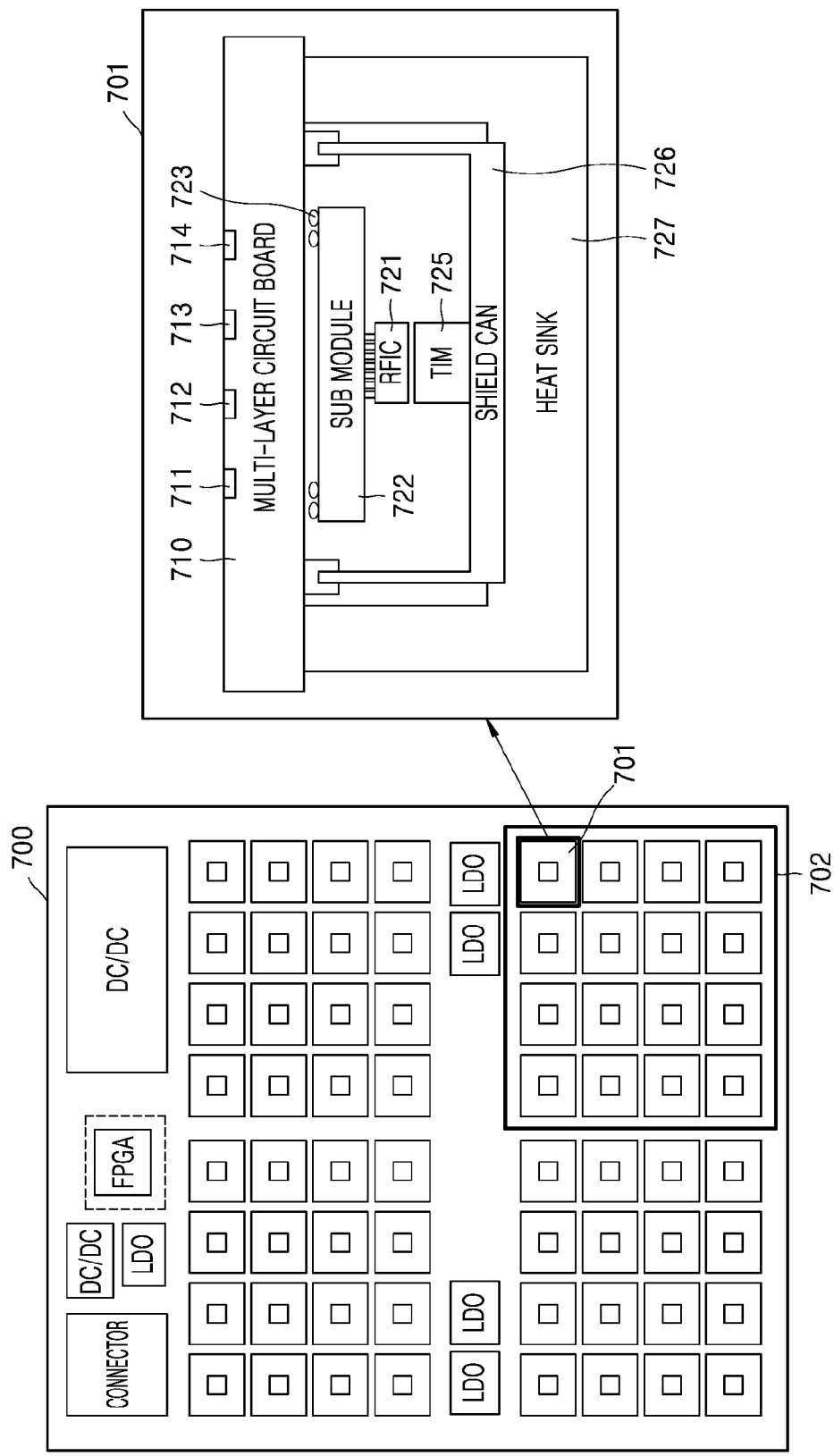
FIG. 7 shows a structure of an RF package module according to another embodiment.

FIG. 7 shows a structure of an RF package module according to another embodiment.

The RF package module 100 according to an embodiment may be included in an electronic device (not shown) that is used in a wireless communication system, together with a baseband module connected to the RF package module 100 to transmit and receive signal to and from the RF package module 100 and process baseband signals For example, the electronic device may include a base station, Customer Premise Equipment (CPE) such as a home router, a user terminal such as a mobile phone, etc., and the structure of the RF package module 100 may change according to a purpose of use of the electronic device and a frequency band supported by the electronic device. Therefore, processes that are used when the RF package module 100 is manufactured may also change accordingly.

Referring to FIG. 7, an RF package module 700 according to an embodiment may be an RF package module that is used in a base station for millimeter band communication. The RF package module 700 may include a plurality of antennas and a plurality of RFICs, or may include a plurality of units 701 each including a signal RFIC and a plurality of antennas. For example, one unit 701 may include 16 antennas and an RFIC, although not limited thereto. However, the number of antennas included in the one unit 701 may change according to embodiments. Also, the RF package module 700 may group 16 units 701 into one module 702, and include a plurality of modules 702 to provide Multi Input Multi Output (MIMO), as shown in FIG. 7.

A right part of FIG. 7 shows a detailed structure of one unit included in the RF package module 700. Each of the plurality of units 701 included in the RF package module 700 may include a structure in which a sub module 722 including an RFIC 721 is connected to a lower end of a multi-layer circuit board 710, wherein the sub module 722 may be connected to the multi-layer circuit board 710 by a BGA process 732 or a LGA process. Also, the one unit 701 may include a structure in which a thermal interface material (TIM) 725 may be attached to one surface of the RFIC 721 to easily radiate heat generated from the RFIC 721 to outside.

Also, a shield can 726 may be used to prevent a radio frequency signal from interfering with other circuits. In a right part of FIG. 7, the shield can 726 is, for convenience of description, shown to be attached to the one unit 701. However, due to limited spaces between the units 701, a single shield can may be attached to the entire units 701 included in the RF package module 700.

Also, a heat sink 727 may be additionally attached to the thermal interface material 725 to easily radiate heat generated from the RFIC 721 to the outside.

The unit 701 may include a plurality of antennas 711, 712, 713, and 714 mounted on one surface of the multi-layer circuit board 710. As shown in the right part of FIG. 7, the unit 701 includes 4 antennas, However, the unit 701 may include 16 antennas, as described above, and the number of antennas included in the unit 701 may change according to embodiments.

The aforementioned descriptions of the disclosure are only for illustrative purposes, and it will be apparent that those skilled in the art can make various modifications thereto without changing the technical spirit and essential features of the disclosure. Thus, it should be understood that the exemplary embodiments described above are merely for illustrative purposes and not for limitation purposes in all aspects. For example, although an arrangement example of antennas, signal transmission lines, signal vias, and ground vias included in a single-layer circuit board has been described in detail, the arrangement example is illustrative, and positions or shapes of the lines may change in various ways.

The scope of the disclosure is shown by the claims to be described below rather than the detailed description, and it is to be construed that the meaning and scope of the claims and all modifications or modified forms derived from the equivalent concept thereof are encompassed within the scope of the disclosure.

The invention claimed is:

1. An RF package module comprising:
    a sub module including a Radio Frequency Integrated Chip (RFIC);
    an antenna configured to transmit and receive a signal wirelessly through a predetermined metal pattern; and
    a multi-layer circuit board including a plurality of layers in which a signal via for transferring the signal between the RFIC and the antenna and one or more ground vias are formed,
    wherein the antenna is spaced from the one or more ground vias by one or more anti-pads.

2. The RF package module of claim 1, wherein the one or more anti-pads are arranged not to overlap each other.

3. The RF package module of claim 1, wherein a radius of the one or more anti-pads is greater by a predetermined length than a radius of pads of the one or more ground vias.

4. The RF package module of claim 1, wherein a radius of the one or more anti-pads is determined according to a kind of a dielectric in the multi-layer circuit board.

5. The RF package module of claim 1, wherein the sub module is connected to one surface of the multi-layer circuit board.

6. The RF package module of claim 5, wherein the sub module is connected to the multi-layer circuit board through a Ball Grid Array (BGA) process or a Land Grid Array (LGA) process.

7. The RF package module of claim 1, wherein the antenna includes a patch antenna positioned on one surface of the multi-layer circuit board.

8. The RF package module of claim 1, wherein the RF package module is configured to radiate a signal in a millimeter band.

9. The RF package module of claim 1, wherein the signal via includes a through hole via penetrating the plurality of layers of the multi-layer circuit board, and
    the one or more anti-pads are formed in an area where the through hole via is connected to the antenna.

10. The RF package module of claim 1, wherein the one or more ground vias shield the signal via and are spaced by a predetermined distance or more from the signal via.

11. The RF package module of claim 1, wherein the one or more ground vias surround the signal via.

12. The RF package module of claim 1, wherein the sub module is a second multi-layer circuit board including the RFIC and a plurality of circuit devices electrically connected to the RFIC.

13. An electronic device comprising:
    a sub module including an Radio Frequency Integrated Chip (RFIC);
    an antenna configured to transmit and receive a signal wirelessly through a predetermined metal pattern;
    a multi-layer circuit board including a plurality of layers in which a signal via for transferring the signal between the RFIC and the antenna and one or more ground vias are formed, wherein the antenna is spaced from the one or more ground vias by one or more anti-pads; and
    a baseband module electrically connected to the multi-layer circuit board, and configured to transmit and receive a baseband signal to and from the RFIC and process the baseband signal.

* * * * *

UNITED STATES PATENT AND TRADEMARK OFFICE
CERTIFICATE OF CORRECTION

| | |
|---|---|
| PATENT NO. | : 11,357,099 B2 |
| APPLICATION NO. | : 16/756593 |
| DATED | : June 7, 2022 |
| INVENTOR(S) | : Kwang-hyun Baek et al. |

It is certified that error appears in the above-identified patent and that said Letters Patent is hereby corrected as shown below:

On the Title Page

Column 1, Item (72), Line 1, "Kwang-Hyun Baek" should read -- Kwang-hyun Baek --.

Signed and Sealed this
Twentieth Day of December, 2022

Katherine Kelly Vidal
*Director of the United States Patent and Trademark Office*